United States Patent [19]
Sano

[11] Patent Number: 5,384,687
[45] Date of Patent: Jan. 24, 1995

[54] COOLING STRUCTURE FOR ELECTRONIC CIRCUIT PACKAGE

[75] Inventor: Toshifumi Sano, Tokyo, Japan

[73] Assignee: NEC Corporation, Tokyo, Japan

[21] Appl. No.: 128,238

[22] Filed: Sep. 29, 1993

[30] Foreign Application Priority Data

Sep. 30, 1992 [JP] Japan .................. 4-262076

[51] Int. Cl.$^6$ .............................. H05K 7/20
[52] U.S. Cl. .................. 361/689; 165/80.4;
165/185; 165/908; 174/16.3; 174/15.1;
257/714; 361/698; 361/705
[58] Field of Search ............... 165/80.4, 104.33, 185,
165/908; 174/16.3, 15.1; 257/714; 361/688,
689, 692, 693, 698, 699, 704, 707–715

[56] References Cited

U.S. PATENT DOCUMENTS

| | | | |
|---|---|---|---|
| 4,590,538 | 5/1986 | Cray, Jr. ................. | 361/385 |
| 4,733,293 | 3/1988 | Gabuzda ................. | 174/16.3 |
| 4,920,574 | 4/1990 | Yamamato et al. ...... | 361/703 |
| 4,977,444 | 12/1990 | Nakajima et al. ....... | 361/689 |
| 5,264,984 | 11/1993 | Akamatsu ............... | 174/16.3 |

FOREIGN PATENT DOCUMENTS 0560478 9/1993 European Pat. Off. .
60-160150 8/1985 Japan .

OTHER PUBLICATIONS

S. Oktay et al., "A Conduction-Cooled Module for High-Performance LSI Devices", IBM J. Res. Develop. vol. 26, No. 1, Jan. 1982, pp. 55–66.
IBM Technical Disclosure Bulletin, vol. 32, No. 8A, Jan. 1990, pp. 168–170.

Primary Examiner—Gregory D. Thompson
Attorney, Agent, or Firm—Sughrue, Mion, Zinn, Macpeak & Seas

[57] ABSTRACT

A cooling structure is used for forced cooling of an electronic circuit package. The cooling structure has a bottom heat radiation plate on which the electronic circuit package is mounted, a nozzle for jetting coolant toward the bottom heat radiation plate, a first vertical heat radiation plate mounted on the bottom heat radiation plate and disposed so as to surround the nozzle openings are formed in the first vertical heat radiation plate for again jetting coolant jetted from the nozzle. A second vertical heat radiation plate is mounted on the bottom heat radiation plate and is disposed so as to surround the first vertical heat radiation plate at least in an opposing relationship to the openings. The coolant jetted from the openings collides with and removes heat from the second vertical heat radiation plate.

12 Claims, 3 Drawing Sheets

COOLING STRUCTURE FOR ELECTRONIC CIRCUIT PACKAGE

CROSS-REFERENCE

This application is related to U.S. application Ser. No. 08/011,755, filed on Feb. 1, 1993 and assigned to the assignee of this application.

BACKGROUND OF THE INVENTION

1. Field of the Invention

This invention relates to a cooling structure for cooling an electronic circuit package.

2. Description of the Related Art

Various structures have been proposed for a cooling structure for use for cooling an electronic circuit package mounted on a circuit board such as a printed circuit board and which generates a great amount of heat.

For example, a cooling structure wherein a piston is resiliently pressed against an integrated circuit by a spring to remove heat from the integrated circuit is disclosed in S. Oktay and H. C. Kammerer, "A Conduction-Cooled Module for High Performance LSI Device," IBM J. RES. DEVELOP, Vol. 26, No. 1, January, 1982. FIG. 1 shows the cooling structure by S. Oktay and H. C. Kammerer. A cold plate 47 in which coolant 48 circulates is provided. A hat 45 is mounted on the cold plate 47 with an intermediate layer 46 interposed therebetween. A spring 42 is accommodated in a cavity of the hat 45, and a piston 43 is mounted at an end of the spring 42. The piston 43 is resiliently pressed against the surface of an integrated circuit 41 by the resilient force of the spring 42. Helium (He) gas 44 is introduced around the integrated circuit 41 and in the cavity of the hat 45. Due to the construction of the cooling structure, heat generated from the integrated circuit 41 is transmitted to the piston 43 and then transmitted to the hat 45 by way of the helium gas 44, whereafter it is transmitted by way of the intermediate layer 46 and radiated to the coolant in the cold plate 47. In contrast, the example employs liquid coolant as the coolant 48 and also discloses a modified structure wherein a fin of a large size is provided in place of the cold plate 47 so as to effect forced air cooling.

In the cooling structure by S. Oktay et al., in order to follow up a fluctuation in height or tilt which occurs when the integrated circuit 41 is mounted on a circuit board, the surface of the piston 43 contacting the integrated circuit is formed as a spherical surface and a gap is provided between the hat 45 and piston 43. However, the spherical profile of the end of the piston and the provision of the gap between the piston and the hat result in a reduction of the effective heat transfer area and a reduction of the cooling performance.

Another cooling structure which makes use of a colliding jet of liquid coolant is disclosed in Japanese Patent Laid-Open Application No. 160150/1985 by Yamamoto et al. FIG. 2 shows the construction of the cooling structure by Yamamoto et al. A heat transfer substrate 52 is provided on the upper surface of an integrated circuit 51 mounted on a circuit board 50. A heat transfer plate 54 is mounted on the heat transfer substrate 52 with a deformable heat transfer member 53 interposed therebetween. Meanwhile, a cooling plate 56 is provided in an opposing relationship to the circuit board 50, and a nozzle 55 projecting from the cooling plate 56 is provided in an opposing relationship to the heat transfer plate 54. The nozzle 55 is provided to jet liquid coolant therefrom. The heat transfer plate 54 and the cooling plate 56 are connected to each other by means of bellows 57 so that coolant jetted from the nozzle 55 is all recovered to the cooling plate 56 side. Heat generated from the integrated circuit 51 is transmitted to the heat transfer plate 54 by way of the heat transfer substrate 52 and the heat transfer member 53. The heat transfer plate 54 is cooled by liquid coolant jetted from the nozzle 55. In the structure shown here, the heat transfer plate is cooled by a jet colliding therewith, and in order to raise the cooling capacity, it is necessary to either raise the flow velocity of the jet of coolant or increase the diameter of the nozzle to increase the flow rate. However, if the flow velocity is raised, the force applied to the integrated circuit increases and may possibly have a bad influence upon the reliability of the connection portion between the integrated circuit and the circuit board. Meanwhile, if the diameter of the nozzle is increased, since coolant flows radially after it collides with the heat transfer plate, a portion of the jet on the outer side portion of the nozzle is disturbed by a flow of another portion of the jet on the central portion of the nozzle after the jet collides with the heat transfer plate. Consequently, although the diameter of the nozzle is increased, there is no proportional rise in cooling capacity, and it is difficult to raise the performance of the entire structure.

In U.S. application Ser. No. 08/011,775, filed on Feb. 1, 1993 and assigned to the assignee of this application, a cooling structure suitable for using low boiling point coolant is disclosed, the disclosure of which is incorporated herein by reference. The cooling structure comprises a tubular fin member having many through-holes of small diameter, a flat plate member which is joined to and seals one end of the tubular fin member, a lid member attached to the end of the tubular fin member and a pipe member used as a nozzle from which coolant is jetted towards the plate member. The pipe member extends through the lid member. In the structure, coolant is supplied from the pipe member and flows out from the through-holes.

SUMMARY OF THE INVENTION

It is an object of the present invention to provide a cooling structure of an electronic circuit package which has an improved cooling capacity.

The object of the present invention is achieved by a cooling structure for an electronic circuit package which comprises a bottom heat radiation plate means on which the electronic circuit package is mounted, a nozzle for jetting coolant therethrough toward the bottom heat radiation plate means, a first vertical heat radiation plate means mounted on the bottom heat radiation plate means and disposed so as to surround the nozzle, an opening formed in the first vertical heat radiation plate means for jetting coolant jetted from the nozzle again, and a second vertical heat radiation plate means mounted on the bottom heat radiation plate means and disposed so as to surround the first vertical heat radiation plate means at least in an opposing relationship to the opening.

The above and other objects, features and advantages of the present invention will become apparent from the following description referring to the accompanying drawings which illustrates examples of preferred embodiments of the present invention.

DESCRIPTION OF THE PREFERRED EMBODIMENTS

Figure 1:
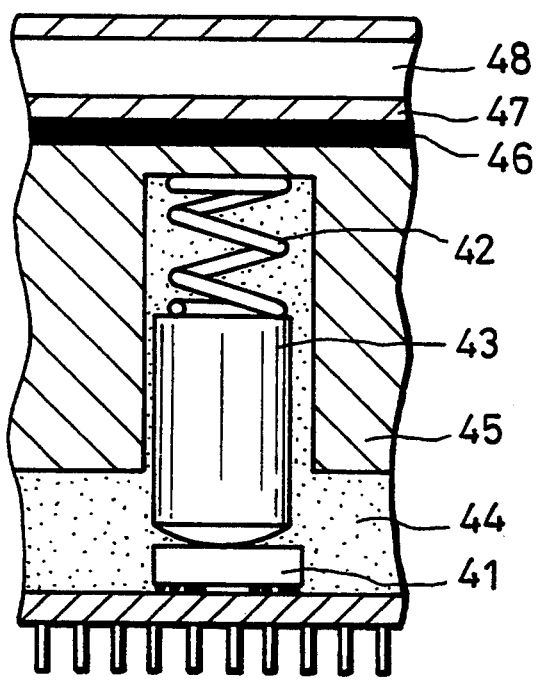
FIG. 1 is a sectional view showing an example of a conventional cooling structure.
Figure 2:
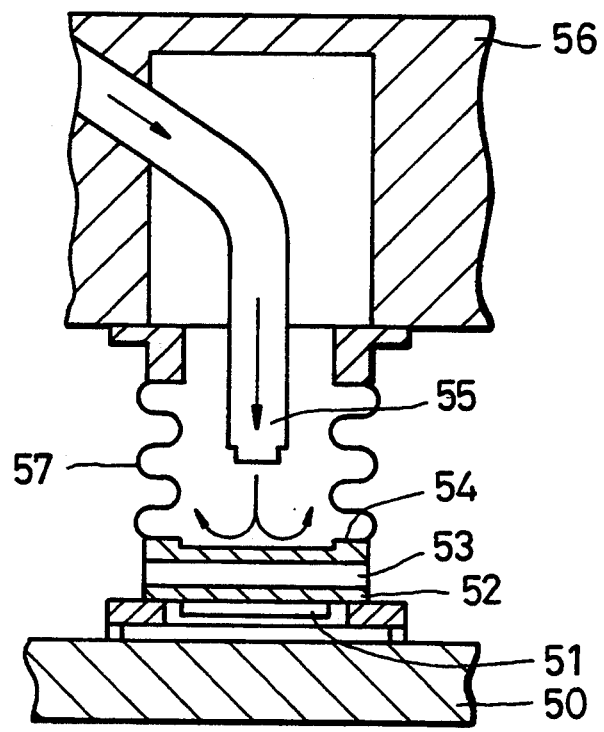
FIG. 2 is a sectional view showing another example of a conventional cooling structure.
Figure 3A:
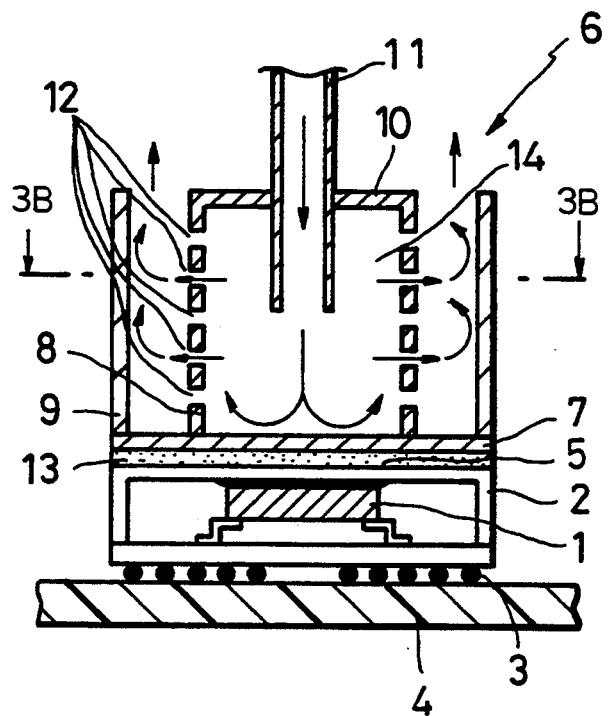
FIG. 3A is a vertical sectional view showing the construction of a cooling structure of an embodiment of the present invention.
Figure 3B:
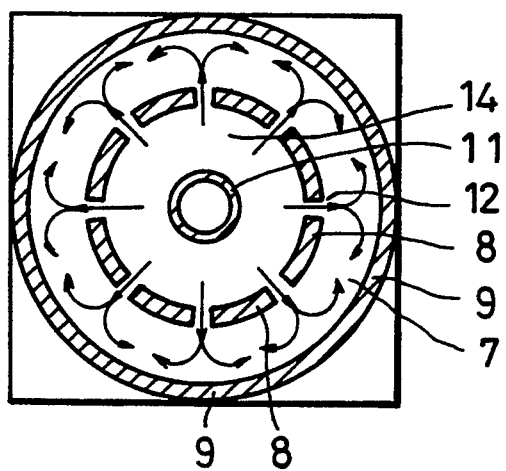
FIG. 3B is a sectional view taken along line A—A' of FIG. 3A.

Preferred embodiments of the present invention will be described with reference to the drawings. First, a first embodiment of the present invention will be described with reference to FIGS. 3A and 3B.

A semiconductor device 1 such as an LSI is accommodated in an LSI case 2. The LSI case 2 is connected to a circuit board 4 by way of solder bumps 3. The surface of the LSI case 2 remote from the circuit board 4 serves as a heat radiation surface 5. By mounting semiconductor device 1 on the heat radiation surface 5 in the inside of the LSI case 2, heat generated from the semiconductor device 1 is transmitted to the heat radiation surface 5 efficiently.

A heat radiation member 6 is brazed to the heat radiation surface 5, and bonding agent 13 having a high heat conductance is introduced into the gap between the heat radiation surface 5 and the heat radiation member 6 to improve the heat transmission characteristic between the heat radiation surface 5 and the heat radiation member 6 and also to assure strong mechanical coupling between them. Naturally, the heat radiation surface 5 and the heat radiation member 6 may alternatively be secured to each other by some other means such as screwing.

The heat radiation member 6 is constituted from a bottom heat radiation plate 7 in the form of a flat plate, a pair of cylindrical vertical heat radiation plates 8 and 9, a top plate 10 and a nozzle 11. The bottom heat radiation plate 7 provides a joining portion of the LSI case 2 to the heat radiation surface 5 and is disposed in parallel to the heat radiation surface 5. Two vertical heat radiation plates 8 and 9 are mounted coaxially on the bottom heat radiation plate 7 so that they extend perpendicularly to the bottom heat radiation plate 7. The mounting method between the bottom heat radiation plate 7 and the vertical heat radiation plates 8 and 9 is devised so as to assure high heat transmission between them. A large number of small holes 12 are formed in radial directions as viewed from above in the inner vertical heat radiation plate 8 so that coolant may be jetted from within the vertical heat radiation plate 8.

The top plate 10 is mounted so that it closes the top end opening of the vertical heat radiation plate 8 on the inner side. Consequently, closed space 14 is defined by the bottom heat radiation plate 7, the vertical heat radiation plate 8 and the top plate 10. The nozzle 11 is provided so that it extends through the center of the top plate 10, and the end of the nozzle 11 is directed toward the bottom heat radiation plate 7. The nozzle 11 is provided for jetting coolant into the space 14, and a jet from the nozzle 11 collides with the bottom heat radiation plate 7.

Heat generated from the semiconductor device 1 is transmitted through the heat radiation face 5 of the LSI case 2 to the bottom heat radiation plate 7 and the vertical heat radiation plates 8 and 9 of the heat radiation member 6. Meanwhile, coolant is jetted from the nozzle 11 into the space 14, and the jet of the coolant collides with and removes heat from the bottom heat radiation plate 7. The jet after the collision expands radially and contacts and removes heat from the inner surface of the vertical heat radiation plate 8, whereafter it jets outwardly from the space 14 through the small holes 12. The jets from the small holes 12 collide with and remove heat from the outer vertical heat radiation plate 9, and then flow out upwardly.

In the present embodiment, since coolant which has jetted from the nozzle 11 and collided with the bottom heat radiation plate 7 is jetted again through the holes 12 and collides with the vertical heat radiation plate 9 on the outer side, the cooling efficiency can be raised without raising the velocity of the jet or without increasing the diameter of the nozzle to increase the flow rate. Accordingly, a desired cooling capacity can be achieved without applying excessive force to the LSI case or the circuit board.

Figure 4A:
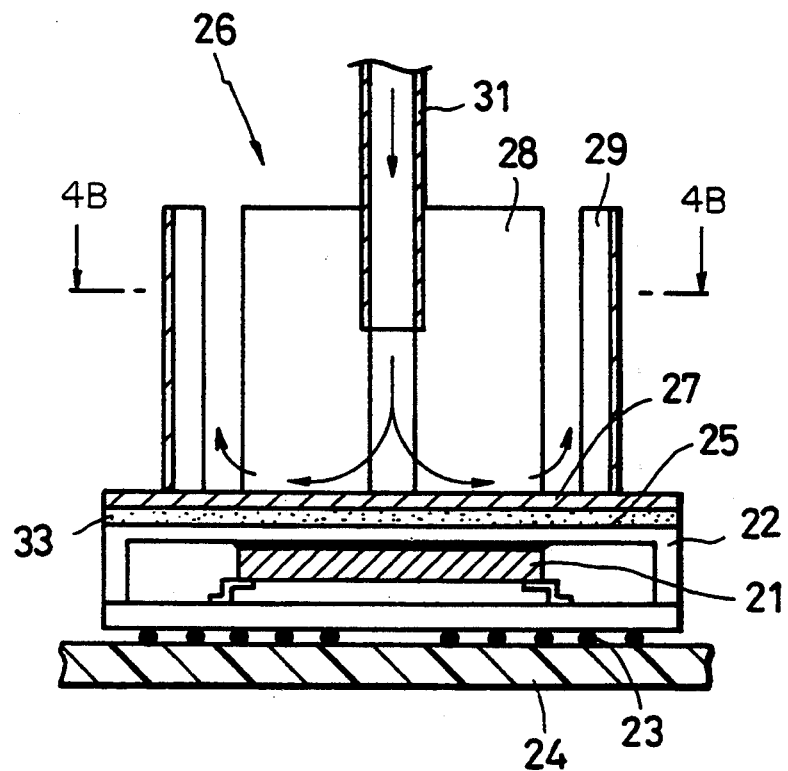
FIG. 4A is a vertical sectional view showing the construction of a cooling structure of another embodiment of the present invention.
Figure 4B:
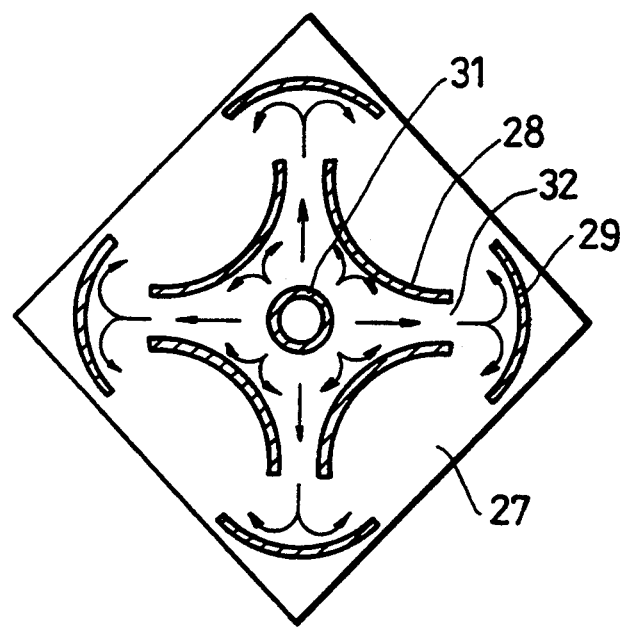
FIG. 4B is a sectional view taken along line B—B' of FIG. 4A.

Next, a second embodiment of the present invention will be described with reference to FIGS. 4A and 4B. The cooling structure shown in the present embodiment differs from the first embodiment described above in the construction of the heat radiation member.

A semiconductor device 21 is accommodated in an LSI case 22 connected to a circuit board 24 by way of solder bumps 23. The surface of the LSI case 22 remote from the circuit board 24 serves as a heat radiation surface 25. Heat generated from the semiconductor device 21 in the inside of the LSI case 22 is transmitted efficiently to the heat radiation surface 25.

A heat radiation member 26 is brazed to the heat radiation surface 25, and bonding agent 33 having a high heat conductance is introduced into the gap between the heat radiation surface 25 and the heat radiation member 26. Naturally, the heat radiation surface 25 and the heat radiation member 26 may alternatively be secured to each other by some other means such as screwing.

The heat radiation member 26 is constituted from a bottom heat radiation plate 27 in the form of a flat plate, four inner vertical heat radiation plates 28 of a curved profile, four outer vertical heat radiation plates 29 of a similarly curved profile, and a nozzle 31. The bottom heat radiation plate 27 provides a joining portion of the LSI case 22 to the heat radiation surface 25 and is disposed in parallel to the heat radiation surface 25.

The four inner vertical heat radiation plates 28 are mounted on and extend perpendicularly from the bottom heat radiation plate 7 with the convex surfaces thereof directed inwardly in such a manner that they do not overlap with each other. Vertically extending gaps 32 are formed between each adjacent pair of the inner vertical heat radiation plates 28. The four outer vertical heat radiation plates 29 are provided in an opposing relationship to the gaps 32, one outer vertical heat radiation plate 29 being provided for each individual gap 32. The outer vertical heat radiation plates 29 are disposed on and extend perpendicularly from the bottom heat radiation plate 27 in such a manner that the concave surfaces thereof oppose the gaps 32.

The nozzle 31 is provided so as to jet coolant into the space defined by the four inner vertical heat radiation plates 28 and is disposed at the central position among the inner vertical heat radiation plates 28 in such a manner that the open end thereof is directed toward the bottom heat radiation plate 27. A jet of coolant from the nozzle 31 collides with the bottom heat radiation plate 27.

Heat generated from the semiconductor device 21 is transmitted by way of the heat radiation surface 25 of the LSI case 22 to the bottom heat radiation plate 27 and the inner and outer vertical heat radiation plates 28 and 29 of the heat radiation member 26. Meanwhile, coolant is jetted from the nozzle 31 into the space defined by the inner vertical heat radiation plates 28, and the jet of the coolant collides with and removes heat from the bottom heat radiation plate 27. After collision, the jet expands radially and collides with and removes heat from the inner surfaces of the inner vertical heat radiation plates 28. Since the inner vertical heat radiation plates 28 are curved, the coolant is introduced into the gaps 32 in such a manner as to be changed into jets again, and the jets collide with and remove heat from the outer vertical heat radiation plates 29 disposed on the outer side.

In the present embodiment, since coolant which has been jetted from the nozzle 31 to collide with the bottom heat radiation plate 27 is again converted into jets by the inner vertical heat radiation plates 28 which thereafter collide with the vertical heat radiation plates 29 on the outer side, the cooling efficiency can be raised without raising the velocity of the jet or without increasing the diameter of the nozzle to increase the flow rate. Accordingly, a desired cooling capacity can be achieved without applying excessive force to the LSI case or the circuit board. Although in the foregoing description the number of inner vertical heat radiation plates 28 disposed on the inner side and outer vertical heat radiation plates 29 disposed on the outer side are both set to 4, the number of the inner and outer vertical heat radiation plates 28 and 29 is not limited to a specific number but may be any arbitrary number.

It is to be understood that the variations and modifications of the cooling structure disclosed herein will be evident to those skilled in the art. It is intended that all such modifications and variations be included in the scope of the appended claims.

What is claimed is:

1. A cooling structure for use for cooling an electronic circuit package, comprising:
   a bottom heat radiation plate means on which an electronic circuit package is mounted;
   a nozzle for jetting coolant therethrough toward said bottom heat radiation plate means;
   a first vertical heat radiation plate means mounted on said bottom heat radiation plate means and disposed so as to surround said nozzle;
   an opening formed in said first vertical heat radiation plate means for again jetting coolant jetted from said nozzle; and
   a second vertical heat radiation plate means mounted on said bottom heat radiation plate means and disposed so as to surround said first vertical heat radiation plate means at least in an opposing relationship to said opening.

2. The cooling structure for an electronic circuit package as claimed in claim 1, wherein said first and second vertical heat radiation plate means are cylindrical members which are coaxial with each other, and said opening is a plurality of small holes formed in said first vertical heat radiation plate means.

3. The cooling structure for an electronic circuit package as claimed in claim 2, further comprising a top plate member for closing a top end opening of said first vertical heat radiation plate means, and wherein said nozzle extends through said top plate member.

4. The cooling structure for an electronic circuit package as claimed in claim 3, wherein a heat radiation surface of an electronic circuit package and said bottom heat radiation plate means extend in parallel to each other.

5. The cooling structure for an electronic circuit package as claimed in claim 4, wherein bonding agent is introduced into the gap between the heat radiation surface of an electronic circuit package and said bottom heat radiation plate means.

6. The cooling structure for an electronic circuit package as claimed in claim 4, wherein said bottom heat radiation plate means is adapted to be secured to a heat radiation surface of an electronic circuit package.

7. The cooling structure for an electronic circuit package as claimed in claim 1, wherein said first vertical heat radiation plate means is constituted from a plurality of first curved plate members provided uprightly on said bottom heat radiation plate means, and said first curved plate members are disposed in such a manner that the curved convex surfaces thereof oppose each other and gaps formed between said first curved plate members serve as an openings.

8. The cooling structure for an electronic circuit package as claimed in claim 7, wherein said second vertical heat radiation plate means is constituted from a plurality of second curved plate members provided uprightly on said bottom heat radiation plate means, and one of said second curved plate members is provided for each of said openings and disposed in such a manner that the curved concave surface thereof opposes said opening.

9. The cooling structure for an electronic circuit package as claimed in claim 8, wherein said nozzle is inserted in a space within said first curved plate members and is located opposite a surface of said bottom heat radiation plate means.

10. The cooling structure for an electronic circuit package as claimed in claim 8, wherein a heat radiation surface of an electronic circuit package and said bottom heat radiation plate means extend in parallel to each other.

11. The cooling structure for an electronic circuit package as claimed in claim 10, wherein bonding agent is introduced into the gap between the heat radiation surface of an electronic circuit package and said bottom heat radiation plate means.

12. The cooling structure for an electronic circuit package as claimed in claim 10, wherein said bottom heat radiation plate means is adapted to be secured to a heat radiation surface of an electronic circuit package.

* * * * *